US005793232A

United States Patent [19]

Gallinari et al.

[11] Patent Number: 5,793,232

[45] Date of Patent: Aug. 11, 1998

[54] DRIVER CIRCUIT FOR AN INJECTOR

[75] Inventors: Maurizio Gallinari, Pavia; Giampietro Maggioni, Milan; Michelangelo Mazzucco, Alessandria, all of Italy

[73] Assignees: SGS-Thomson Microelectronics S.r.l., Agrate Brianza; Magneti Marelli, Milan, both of Italy

[21] Appl. No.: 744,867

[22] Filed: Nov. 7, 1996

[30] Foreign Application Priority Data

Nov. 7, 1995 [EP] European Pat. Off. .............. 95830471

[51] Int. Cl.$^{6}$ ............................ H03K 19/084; G05F 1/10

[52] U.S. Cl. .......................... 327/110; 327/434; 327/326; 327/312; 327/530; 327/535

[58] Field of Search .................................... 327/110, 108, 327/530, 433, 326, 368, 584, 538, 540, 535, 434, 312

[56] References Cited

U.S. PATENT DOCUMENTS

| | | | |
|---|---|---|---|
| 3,302,036 | 1/1967 | Cosentimo et al. | 327/194 |
| 4,190,022 | 2/1980 | Long | 123/490 |
| 5,483,191 | 1/1996 | Blodgett | 327/434 |
| 5,561,389 | 10/1996 | Duley | 327/143 |

FOREIGN PATENT DOCUMENTS

| | | |
|---|---|---|
| 0380881 | 8/1990 | European Pat. Off. . |
| 0535797 | 4/1993 | European Pat. Off. . |
| 2670832 | 6/1992 | France . |
| 2281667 | 3/1995 | United Kingdom . |

*Primary Examiner*—Timothy P. Callahan
*Assistant Examiner*—Dinh Le
*Attorney, Agent, or Firm*—Allen, Dyer, Doppelt, Milbrath & Gilchrist, P.A.

[57] ABSTRACT

An injector control circuit for a motor vehicle electronic injection system utilizing current recirculation to control an injector actuation winding provided with a circuit configuration containing a constant current generator operable to eliminate the problems of instability and sensitivity to supply line interruptions to which prior art control circuits are subject.

33 Claims, 5 Drawing Sheets

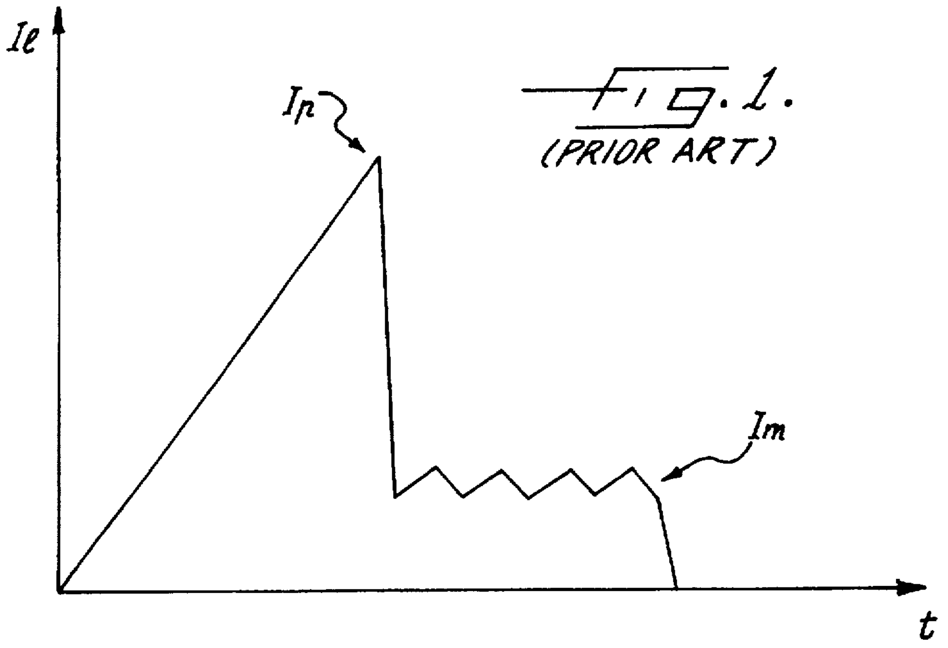
Fig. 1.
(PRIOR ART)
Fig. 2.
(PRIOR ART)
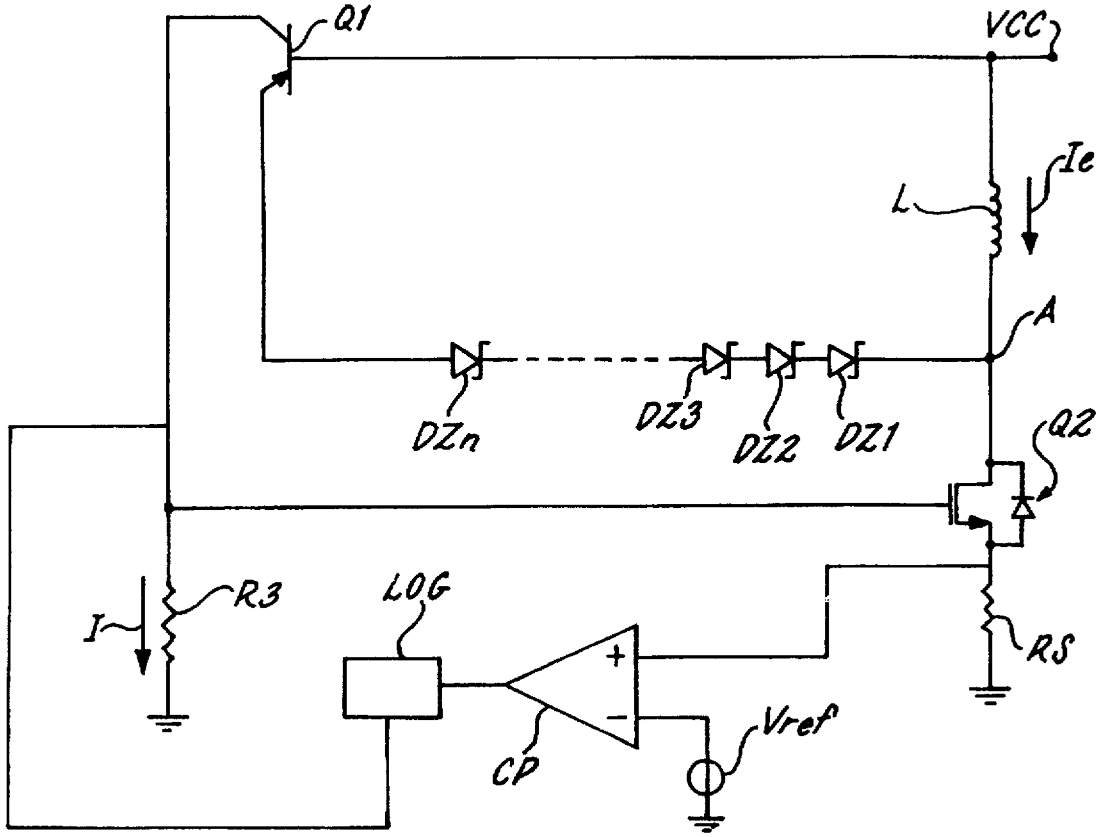

DRIVER CIRCUIT FOR AN INJECTOR

CROSS REFERENCE TO RELATED APPLICATIONS

This application claims priority from EP 95830471.9, filed Nov. 7, 1995.

BACKGROUND AND SUMMARY OF THE INVENTION

The invention relates to a control circuit for an injector of an internal combustion engine. More specifically the invention relates to an injector control circuit which finds application in the motor vehicle field.

The operating principle of a known electronic injection heat engine fuel supply system is based on the possibility of opening a path for the fuel by means of an electronically controlled valve called an injector.

An injector is typically constituted by a nozzle which can be closed by a shutter element in the form of a pin or needle. This shutter element is typically urged by a spring towards the nozzle so as to shut it.

Opening of the injector is triggered by a magnetic field which is obtained by controlling the current in an inductor wound around a core so as to withdraw the shutter element by overcoming the action of the associated spring.

For the purpose of reducing the dissipation of power and therefore heat, the control operation is split into two phases:

- a first phase during which it is necessary to open the injector and therefore during which a high magnetic field is necessary (peak phase),
- a second, subsequent phase in which the injector must be maintained open, in which a magnetic field of lower intensity is sufficient (maintenance phase).

In FIG. 1 is plotted the typical variation of the injector control current Il, as a function of time t. As can be observed, the current Il in the injector winding or inductor has a peak Ip of high value in a first phase after which it falls to and remains substantially constant at a lower value Im. The undulating variation of the current Il in the maintenance phase is due to the use of control circuits of the commutation type which make it unnecessary to have active elements in the linear zone and therefore reduce the power dissipation.

Because of problems related to the specific application, the transfer from the peak phase to the maintenance phase must take place rapidly, that is to say with a steep wave front. This can be achieved by recirculating the current Il at high voltage in the injector winding.

For a better understanding, a prior art injector control circuit is shown in FIG. 2.

When the current Il in the winding L reaches the peak value Ip a voltage comparator CP commutes causing a DMOS transistor Q2 to turn off. The voltage comparator CP uses a measurement resistor RS to detect the current through the winding L and is connected to a voltage reference source Vref in such a way as to commute upon reaching the peak value Ip. The output of the comparator CP is connected by means of an interface circuit LOG to the gate terminal of the transistor Q2 which is in series with the winding L.

The circuit further includes a bipolar PNP transistor Q1, the base of which is connected to the supply VCC of the circuit, and the collector of which is connected to the gate of the transistor Q2. The emitter of the transistor Q1, on the other hand, is connected, as illustrated, to one terminal of a plurality of series connected zener diodes DZ1, DZ2, DZ3 . . . DZn connected, as illustrated, to a common node A between the winding L and the DMOS transistor Q2. A resistor R3 is also provided as biasing resistor for the gate of the transistor Q2, connected between the gate of the transistor Q2 and ground, through which flows a current I.

If the Lenz law is applied one has:

$$v(t)=-L\,di(t)/dt.$$

The voltage on the node A rises until it reaches a value given by:

$$V(A)=VCC+VCL+Vbe(Q1)$$

where:

$$VCL=VDZ1+\ldots+VDZn$$

Where VDZ=the zener voltage.

The number of zener diodes necessary depends on the voltage value at which it is desired to drain off the load current through the DMOS transistor Q2, which remains in conduction because of the current I which fixes its gate voltage. Through the recirculation the current Il falls to the maintenance value Im.

This known prior art circuit, however, has problems of stability due to the fact that the resistor R3 which biases the gate of the DMOS transistor Q2 in the recirculation phase must be of low value in order to discharge the gate of the transistor Q2 quickly. Moreover the parameter gm=Ic/vt of the transistor Q1 must be high since it is necessary to provide sufficient current to raise the voltage on the gate of the transistor Q2 whereby to hold it in conduction in the recirculation phase.

Moreover, if an interruption occurs in the supply line while the recirculation phase is active the circuit finds itself with the PNP transistor Q1 having a low base voltage (even 0 volts), and therefore the collector of the transistor Q1 does not have a sufficient voltage to guarantee the conduction state of the transistor Q2. The recirculation to ground is no longer possible since the transistor Q2 does not remain conductive.

The object of the present invention is that of providing an injector control circuit in which the above-mentioned disadvantages can be resolved.

According to the present invention this object is achieved by an injector control circuit having the characteristics specifically set out in the claims which follow.

BRIEF DESCRIPTION OF THE DRAWING

The invention will now be described, purely by way of non-limitative example, with reference to the attached drawings, in which:

FIG. 1 is a cartesian diagram illustrating the operation of the circuit to which the present invention relates and has already been described with reference to the prior art;

FIG. 2 is a circuit diagram of a prior art device and has already been described;

DETAILED DESCRIPTION

Figure 3:
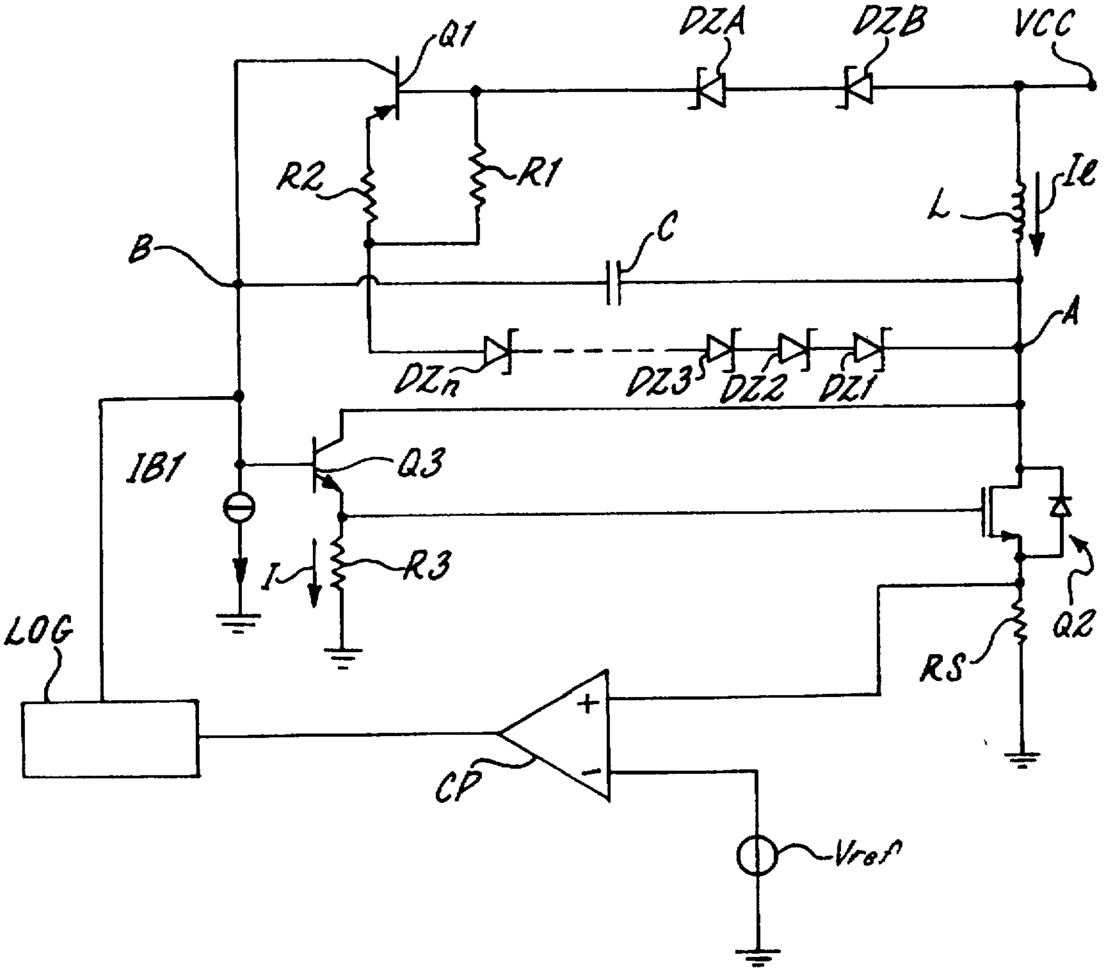
FIG. 3 is a block-schematic diagram of a possible embodiment of the circuit according to the present invention.

In FIG. 3 is shown a possible embodiment of an injector control circuit according to the present invention. The present invention essentially consists of:

the introduction of a resistor R2, a transistor Q3, a current generator IB1 and a capacitor C between the terminal A and the collector of the transistor Q1 to eliminate the problems relating to the loss of stability.

the positioning of two zener diodes (for example DZA and DZB) on the base of the transistor Q1 with the introduction of the resistor R1, operable to prevent losses, to resolve the problems related to the compatibility of the recirculation structure during interruptions to the supply line.

In this case the voltage on the node A in the recirculation phase reaches the value given by:

$$V(A)=VCC+VCL+Vbe(Q1)+R2*IZ$$

where IZ is the current which flows through the zener diodes DZ1, . . . , DZn.

It is observed that the term VCL is the same as in the preceding case (FIG. 2) because it is given by the sum of the voltages VDZ1+. . . +VDZn+VDZA+VDZB, the overall number of zener diodes being unchanged.

In this way, if the voltage on the supply line should fall, the gate of the transistor Q2 remains biased and the transistor Q3 in conduction because the two zener diodes DZA, DZB connected to the base of the PNP transistor Q1 and supplied via the resistor R1 provide sufficient voltage to the base of the transistor Q1 for the collector of this transistor Q1 to have a sufficiently high voltage.

Figure 4:
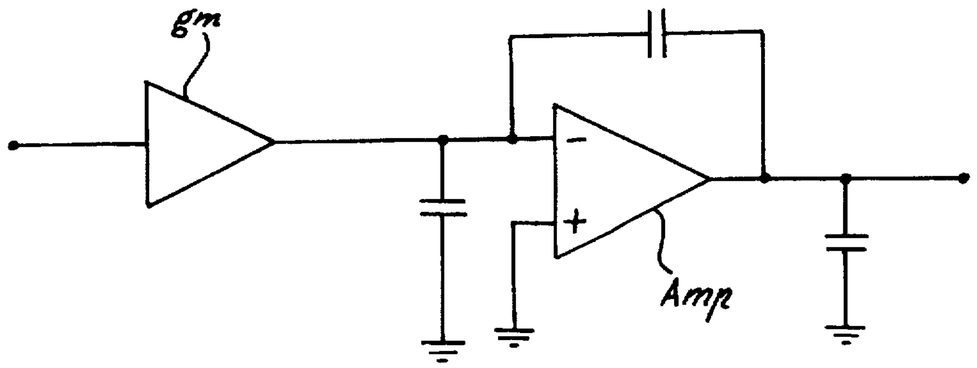
FIG. 4 is a block-schematic diagram of the embodiment of FIG. 3.

There now follows an analysis relating to the stabilization of the circuit according to the invention. The capacitor C, which is integrable, serves to return the circuit to a classic "dominant pole" structure in which the so-called pole-splitting of the capacitor C is effected for separating the input and output poles of the operational amplifier Amp of FIG. 4. The circuit of FIG. 4 is equivalent to the circuit of FIG. 3 as far as the gain is concerned. These poles, of the transfer function of the circuit in question, are given by the parasitic capacities of the structure. Moreover, the gain-band product of the circuit is controlled in that gm is controlled.

It can be seen that gm is controlled because the transistor Q1 is supplied with a constant current determined by the current generator IB1 and, moreover, if a very small gm should be sufficient it is possible to introduce an emitter degeneration constituted by the resistor R2. In fact, the current of the generator IB1 cannot be reduced excessively because it must be able to discharge the base of the transistor Q3 quickly. In this way, if the resistor R2 has a very high value one has that:

$$gm=1/R2$$

and therefore gm is controlled.

Consequently, the biasing current of the two series of zener diodes is constant:

$$IZ[DZA,DZB]=(Vbe(Q1)+R2*IB1)/R1$$

$$IZ[DZ1 \ldots DZn]=IB1+(Vbe(Q1)+R2*IB1)/R1$$

Thus the fact that a lot of current is needed to put the transistor Q2 into conduction is no longer binding. The current in the zener diodes is adjustable through the current IB1.

Numerous advantages are therefore obtained with the present invention. These advantages are substantially as follows:

the feedback network of the recirculation structure is frequency compensated and therefore stable because the transistor Q1 is constant current biased, gm is controlled (as a consequence of the preceding point), the recirculation structure is compatible with interruptions in the supply line.

If the integration technology adopted for manufacture of the circuit should not allow the use of the transistor Q2, because the biasing voltage is too high, it is possible to use a DMOS type transistor Q4 in its place.

It is also possible to bias the collector of transistor Q3 on the drain terminal of the DMOS transistor Q2, as also the biasing of the transistor Q4.

Figure 5A:
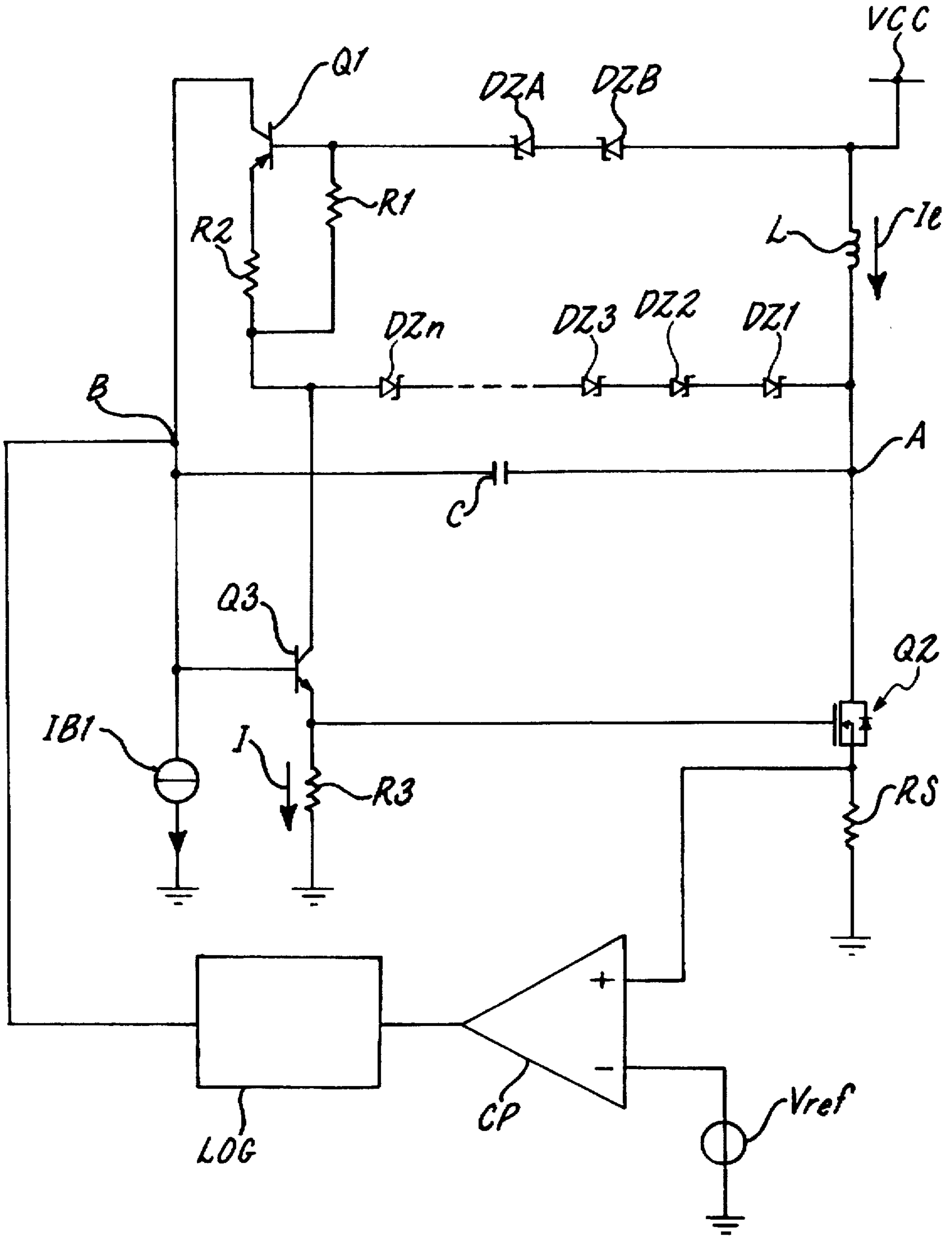
FIGS. 5*a*, 5*b* and 5*c* are schematic circuit diagrams of alternative embodiments of the circuit according to the invention.
Figure 5B:
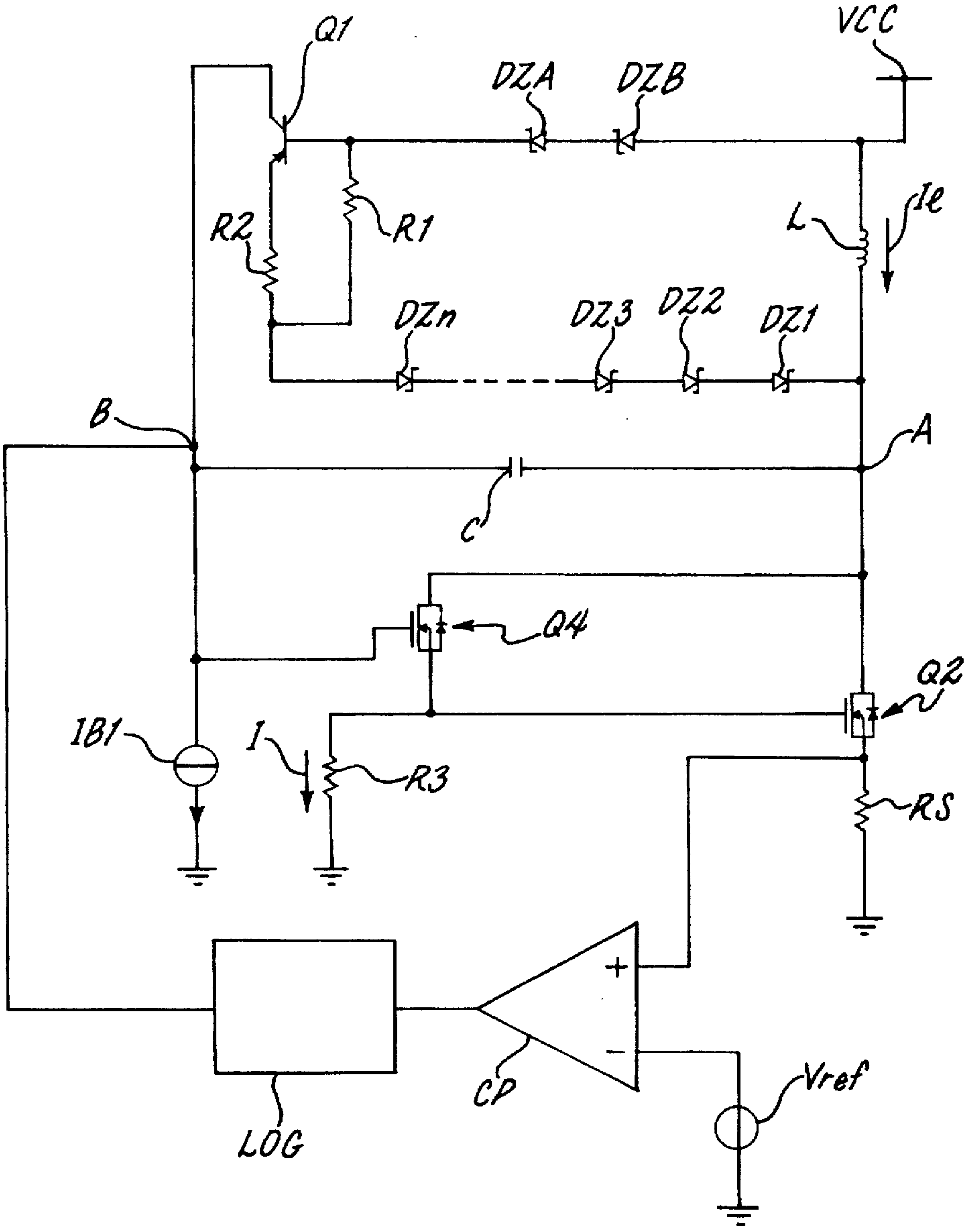
Figure 5C:
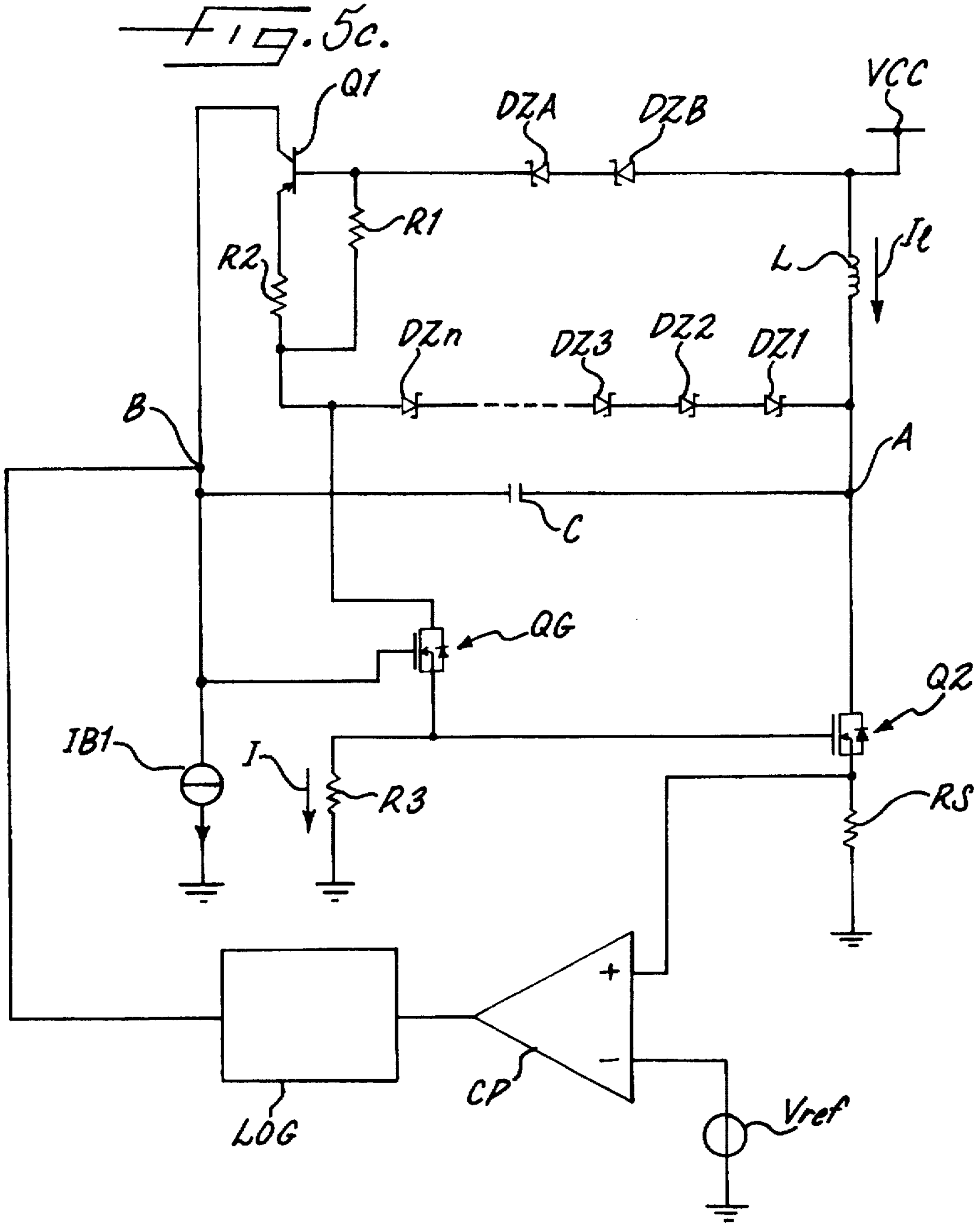

These above-mentioned alternative embodiments are illustrated in FIGS. 5*a*, 5*b* and 5*c*.

Naturally, the principle of the invention remaining the same, the details of construction and the embodiments can be widely varied with respect to what has been described and illustrated, without by this departing from the scope of the present invention.

What is claimed is:

1. An injector control circuit for a heat engine electronic fuel injection system, the control circuit comprising:

first transistor operable to control the passage of an activation current in an injector actuation winding;

a second transistor operable to generate a biasing voltage for a control terminal of the said first transistor; and stabilizing circuit means coupled to said second transistor and a common node between said first transistor and said injector actuation winding operable to stabilize the biasing voltage on the control terminal of said first transistor and thereby stabilize the control circuit, said circuit stabilizing means including at least one capacitor.

2. A control circuit according to claim 1, wherein said stabilizing circuit means further includes bias voltage maintaining means connected to a control terminal of the said second transistor, operable to allow the biasing voltage to be maintained even in the case of short interruptions in the supply voltage supplied to the control circuit.

3. A control circuit according to claim 2, wherein said first transistor is connected in series with said winding and said second transistor is a PNP bipolar transistor having a base terminal connected to a first terminal of said winding and to the voltage source, an emitter terminal connected to a plurality of zener diodes connected in series to a common node to a second terminal of said winding and to an input terminal of said first transistor, and a collector terminal connected to the control terminal of said first transistor and to a control circuit operable to activate the first transistor, and wherein said stabilizing circuit means includes a current generator circuit connected in such a way as to draw current from the control circuit of said first transistor.

4. A control circuit according to claim 3, wherein said current generator circuit is a constant current generator.

5. A control circuit according to claim 3, wherein said stabilizing circuit means further includes a third transistor controlled by said current generator circuit.

6. A control circuit according to claim 5, wherein said third transistor is a DMOS transistor.

7. A control circuit according to claim 1, wherein said at least one capacitor is connected between the second terminal of said winding and the collector of said second transistor.

8. A control circuit according to claim 2, wherein said biasing voltage maintaining means includes at least one zener diode connected between the base of the second transistor and the voltage source.

9. A control circuit according to claim 8, wherein said biasing voltage maintaining means includes two zener diodes connected in series between the base of said second transistor and the voltage source.

10. A control circuit according to claim 3, wherein said biasing voltage maintaining means includes a first resistor connected between the base and the emitter of said second transistor.

11. A control circuit according to claim 10, further including a second resistor connected between said plurality of zener diodes and the emitter of said second transistor.

12. A control circuit according to claim 11, wherein said first resistor is connected to a common node between said second resistor and said plurality of zener diodes.

13. A control circuit according to claim 8, wherein the cathode of said at least one zener diode is connected to the base of said second transistor.

14. A control circuit according to claim 1, wherein the control circuit is formed as an integrated circuit.

15. An integrated circuit comprising:

a first transistor connected to control the current in an inductor winding;

a second transistor connected to provide a biasing voltage to a control terminal of said first transistor;

at least one capacitor connected to said second transistor and a common node between said first transistor and said inductor winding to provide frequency stabilization;

a current generator connected to supply a constant current to said second transistor; and at least two zener diodes operatively connected between a control terminal of said second transistor and a voltage source.

16. The circuit of claim 15, wherein said first transistor is a bipolar PNP transistor and said second transistor is a DMOS transistor.

17. The circuit of claim 15, wherein said current generator controls the current on a third transistor, said third transistor being connected to drive said control terminal of said first transistor.

18. The circuit of claim 15, wherein said second transistor raises the voltage on said control terminal of said first transistor to hold said first transistor in a conduction phase to recirculate the current on said winding, whereby the current on said winding decreases to a maintenance value.

19. An injector control circuit, comprising:

a first transistor connected to control the current in an inductor winding;

a second transistor connected to provide a biasing voltage to a control terminal of said first transistor;

a current generator connected to supply a constant current to said second transistor;

a first resistor connected to a current-carrying terminal of said second transistor;

a capacitor operatively connected to a common node between said inductor winding and said first transistor;

at least two zener diodes operatively connected between a control terminal of said second transistor and a voltage source; and a second resistor operatively connected to said zener diodes and said first resistor.

20. The circuit claim 19, wherein said second resistor has a resistance higher than the resistance of said first resistor, and wherein the current of said zener diodes is constant.

21. The circuit of claim 19, wherein the current in said zener diodes is adjustable using said current generator.

22. The circuit of claim 19, wherein said first transistor is a bipolar PNP transistor and said second transistor is a DMOS transistor.

23. The circuit of claim 19, wherein said control terminal of said first transistor is biased by a third resistor, said third resistor being operatively connected between said control terminal of said first transistor and ground.

24. The circuit of claim 19, wherein said current generator controls the current on a third transistor, said third transistor being connected to drive said control terminal of said first transistor.

25. The circuit of claim 19, wherein said second transistor raises the voltage on said control terminal of said first transistor to hold said first transistor in a conduction phase to recirculate the current on said winding, whereby the current on said winding decreases to a maintenance value.

26. A method of controlling an injector, comprising the steps of:

measuring current in said winding using a first transistor operatively connected to said winding and a voltage comparator connected to compare the voltage across said first transistor with a reference voltage;

recirculating said current in said winding, when said current reaches a peak value, using a second transistor having a first current-carrying terminal operatively connected to a control terminal of said first transistor;

stabilizing the frequency using a capacitor operatively connected to a common node between said winding and said first transistor and said second transistor;

providing at least two zener diodes operatively connected between a control terminal of said second transistor and a voltage source, said control terminal of said second transistor being operatively connected to a first resistor;

supplying said second transistor with a constant current generated by a current generator, said current generator being operatively connected to said first current-carrying terminal of said second transistor; and providing a second resistor operatively connected to a second current-carrying terminal of said second transistor.

27. The method of claim 26, wherein said second resistor has a resistance higher than the resistance of said first resistor, and wherein the current of said zener diodes is constant.

28. The method of claim 26, further comprising the step of adjusting the current in said zener diodes using said current generator.

29. The method of claim 26, wherein said first transistor is a bipolar PNP transistor and said second transistor is a DMOS transistor.

30. The method of claim 26, wherein said control terminal of said first transistor is biased by a third resistor, said third resistor being operatively connected between said control terminal of said first transistor and ground.

31. The method of claim 26, wherein said current generator controls the current on a third transistor, said third transistor being connected to drive said control terminal of said first transistor.

32. The method of claim 26, wherein said second transistor raises the voltage on said control terminal of said first transistor to hold said first transistor in a conduction phase during said step of recirculating.

33. An injector control circuit for a heat engine electronic fuel injection system, the control circuit comprising:

a first transistor operable to control the passage of an activation current in an injector actuation winding;

a second transistor operable to generate a biasing voltage for a control terminal of the said first transistor; and a stabilizing circuit operable to bias the voltage on the control terminal of said first transistor and thereby stabilize the control circuit, said stabilizing circuit including a frequency stabilizing circuit connected to said first transistor and a bias voltage maintaining circuit connected to a control terminal of the said second transistor and operable to allow the biasing voltage to be maintained even in the case of short interruptions in the supply voltage supplied to the control circuit.

* * * * *